(12) United States Patent  (10) Patent No.: US 6,741,089 B2
Conroy  (45) Date of Patent: May 25, 2004

(54) HINGED HEAT SINK BURN-IN SOCKET

(75) Inventor: Chad M. Conroy, Little Canada, MN (US)

(73) Assignee: Micro Control Company, Minneapolis, MN (US)

( * ) Notice: Subject to any disclaimer, the term of this patent is extended or adjusted under 35 U.S.C. 154(b) by 73 days.

(21) Appl. No.: 10/046,889

(22) Filed: Jan. 14, 2002

(65) Prior Publication Data
US 2003/0132770 A1 Jul. 17, 2003

(51) Int. Cl.[7] .......................... G01R 31/02; H01R 12/00
(52) U.S. Cl. ...................... 324/755; 324/158.1; 439/73; 439/331; 361/704
(58) Field of Search ................................ 324/754, 755, 324/158.1, 758, 765; 361/704; 439/73, 331, 330, 329

(56) References Cited

U.S. PATENT DOCUMENTS

| 4,378,139 A | 3/1983 | Griffin et al. | 339/75 |
| 4,993,955 A | 2/1991 | Savant | 439/73 |
| 5,249,972 A | 10/1993 | Walker | 439/72 |
| 5,320,550 A | 6/1994 | Uratsuji et al. | 439/266 |
| 5,493,237 A | 2/1996 | Volz et al. | 324/754 |
| 5,697,795 A | 12/1997 | Abe | 439/73 |
| 5,748,007 A * | 5/1998 | Gaschke | 324/755 |
| 6,086,387 A | 7/2000 | Gallagher et al. | 439/71 |
| 6,514,097 B1 * | 2/2003 | Conroy | 439/330 |
| 6,570,398 B2 * | 5/2003 | Murphy et al. | 324/755 |

* cited by examiner

Primary Examiner—Evan Pert
Assistant Examiner—Paresh Patel
(74) Attorney, Agent, or Firm—Westman, Champlin & Kelly, P.A.

(57) ABSTRACT

A holder for holding an integrated circuit device to be tested in contact with a contact set on a circuit board has a support base that supports a contact set circuit board, and a hinged cover that will move between an open and a closed position. The hinged cover is pivotally mounted on a vertically slidable frame. The frame is cam actuated to move the frame and cover toward and away from the base. When the cam operator is moved to move the cams, to in turn move the frame and cover away from the base, a portion of the cam operator engages an arm on the cover and pivots the cover to an open position. The cover can easily be moved to its closed position manually and then the cam operator becomes accessible for operating the cams to clamp the integrated circuit to be tested against a contact set printed circuit board on the support base.

20 Claims, 7 Drawing Sheets

HINGED HEAT SINK BURN-IN SOCKET

CROSS-REFERENCE TO RELATED APPLICATION

Reference is made to U.S. patent application Ser. No. 09/920,372, filed Aug. 1, 2001, the contents of which is hereby incorporated by reference in its entirety.

BACKGROUND OF THE INVENTION

The present invention relates to a burn-in socket that supports an integrated circuit in position electrically coupled to contacts on a socket supported connector board in a controlled oven environment for burning-in or testing the integrated circuit. Circuit temperature is controlled, in part, with a socket mounted heater and a heat exchanger comprising radiating fins on a hinged cover that will open to permit installing the circuit in place, and afterwards will close easily and clamp tightly to hold the circuit in proper position.

The use of various types of sockets for holding integrated circuits and which control the circuit temperature during burn-in has become more important with the new integrated circuits that generate high amounts of power and thus heat in use. It is necessary to control the environment of the integrated circuit during its burn-in phase to ensure that the circuit is operating properly at various temperature levels.

Sockets for holding integrated circuits on burn-in boards have been advanced, but generally have problems with rapid, accurate loading, and holding the circuit board in intimate contact with a connector or contact board.

A prior art universal test and burn-in socket frame shown in U.S. Pat. No. 5,748,007, includes a clamp for an IC module. This is one form of socket that is known in the art for burn-in testing of IC modules. Many of the prior art sockets have some difficulty in loading and clamping, as well as being quite complex, which raises manufacturing cost and operational problems.

SUMMARY OF THE INVENTION

The present invention relates to a frame or burn-in socket that is easily loaded, and has a support base and a hinged cover that carries a heat exchanger, and which when moved into closed position will clamp an integrated circuit chip or module positively against a test contact set. The cover is held down with an over center lock so that the integrated circuit is positively held in intimate contact with the contact set on a circuit board held on the support base. A temperature sensor is held tightly against the integrated circuit chip as well.

The cover is hinged on one side of the burn-in socket support base, and is carried as showing on a sliding frame. The cover will move vertically, or generally perpendicular to the plane of the circuit board carrying the contact set. A cam actuator is used to obtain the vertical movement relative to the support base. The cam is operated to close or release the cover, as shown by moving the sliding frame to raise and lower the cover relative to the support base holding the test contact. The cams are moved when a bail or handle is moved about its pivot.

The hinged cover is mounted on the sliding frame and raises and lowers with the sliding frame. The cover is also hinged open by an actuator arm moved by the cam handle or bail when the cams are actuated to provide for quick loading and unloading of integrated circuits. The cover will open sufficiently to provide clearance of the center portions of the support base where the test contact set circuit board is held and over which the test integrated circuit is placed and held. The cover is latched and held positively when it is closed.

The hinged cover for the burn-in socket provides full access to the printed circuit board having the test contact set or test connectors. The burn in socket is thus easily loaded with an integrated circuit, which is positively held when the cover is closed. Control of the test temperature also is aided with the use of the finned heat exchanger cover.

DETAILED DESCRIPTION OF THE PREFERRED EMBODIMENTS

Figure 1:
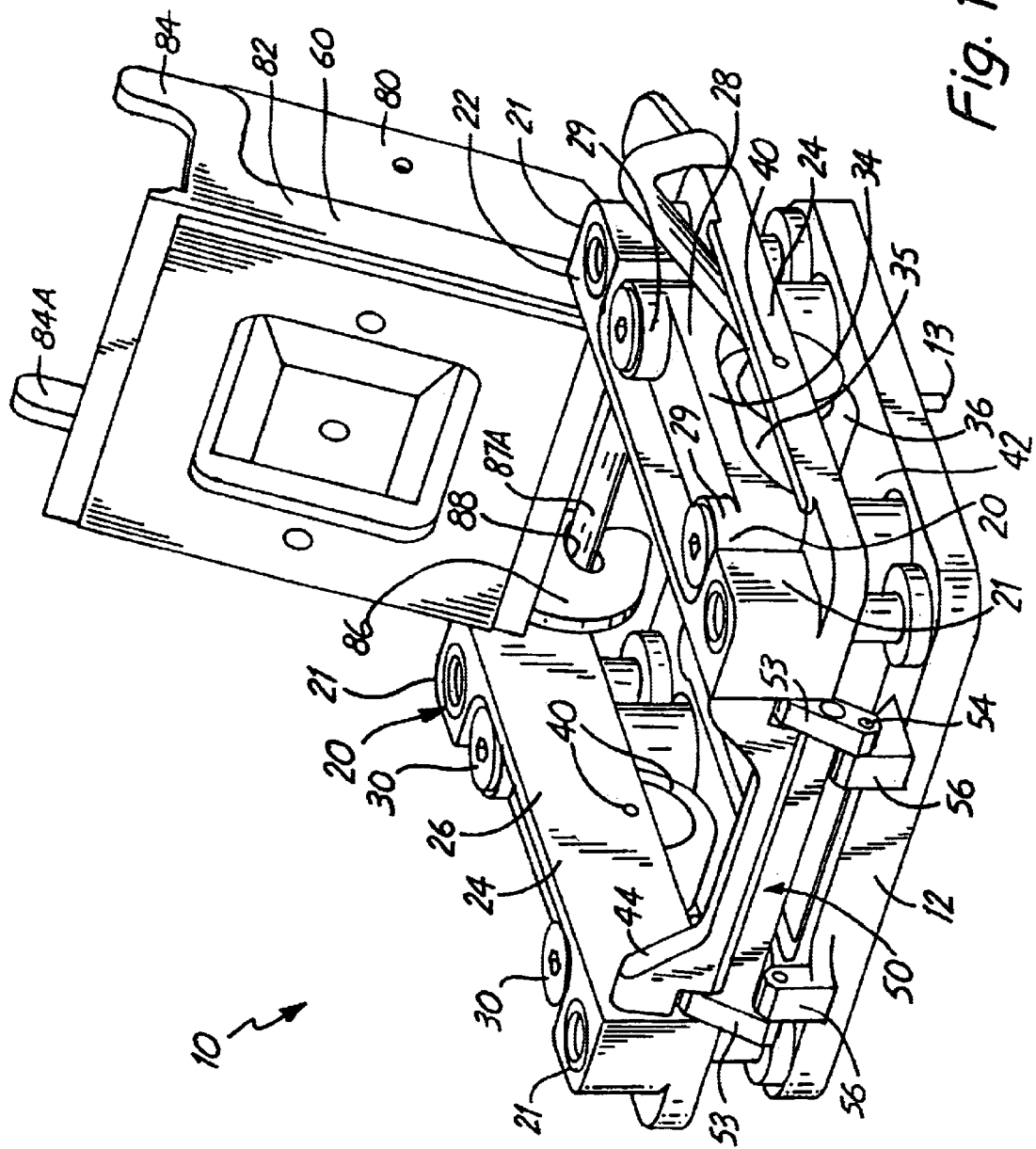
FIG. 1 is a perspective view of a burn-in socket made according to the present invention and shown in an open position.
Figure 2:
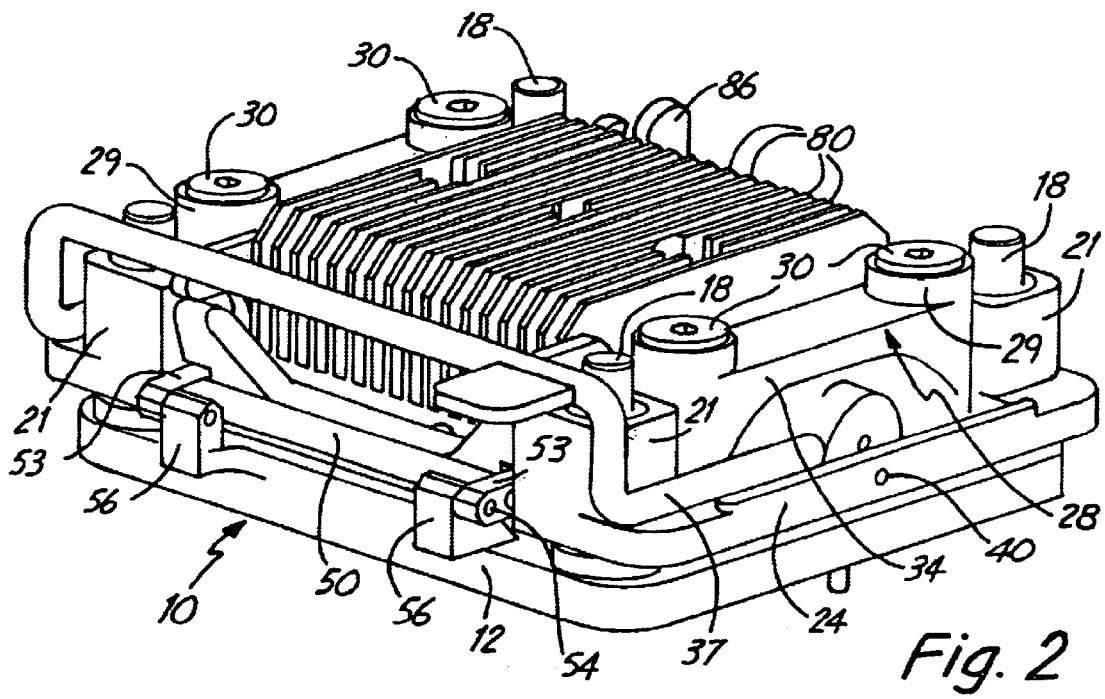
FIG. 2 is a perspective view similar to FIG. 1 but with a hinged cover in a closed position.
Figure 3:
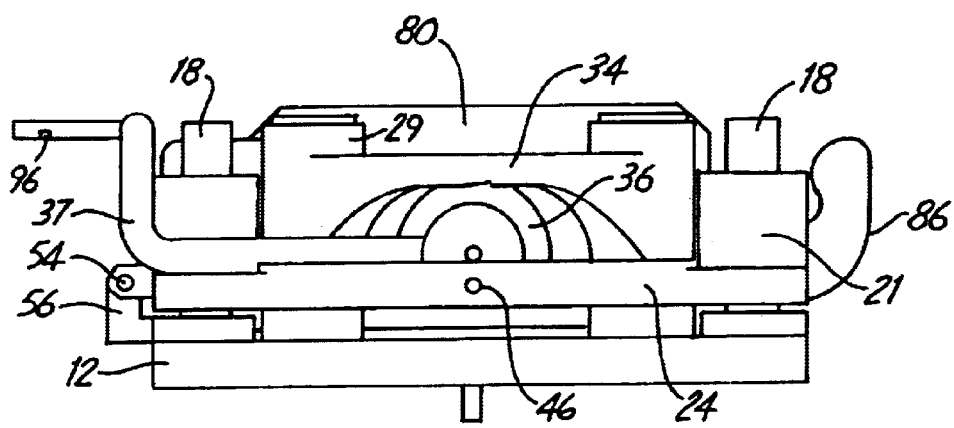
FIG. 3 is a side elevational view of the burn-in socket of FIG. 1 in a closed position.
Figure 5:
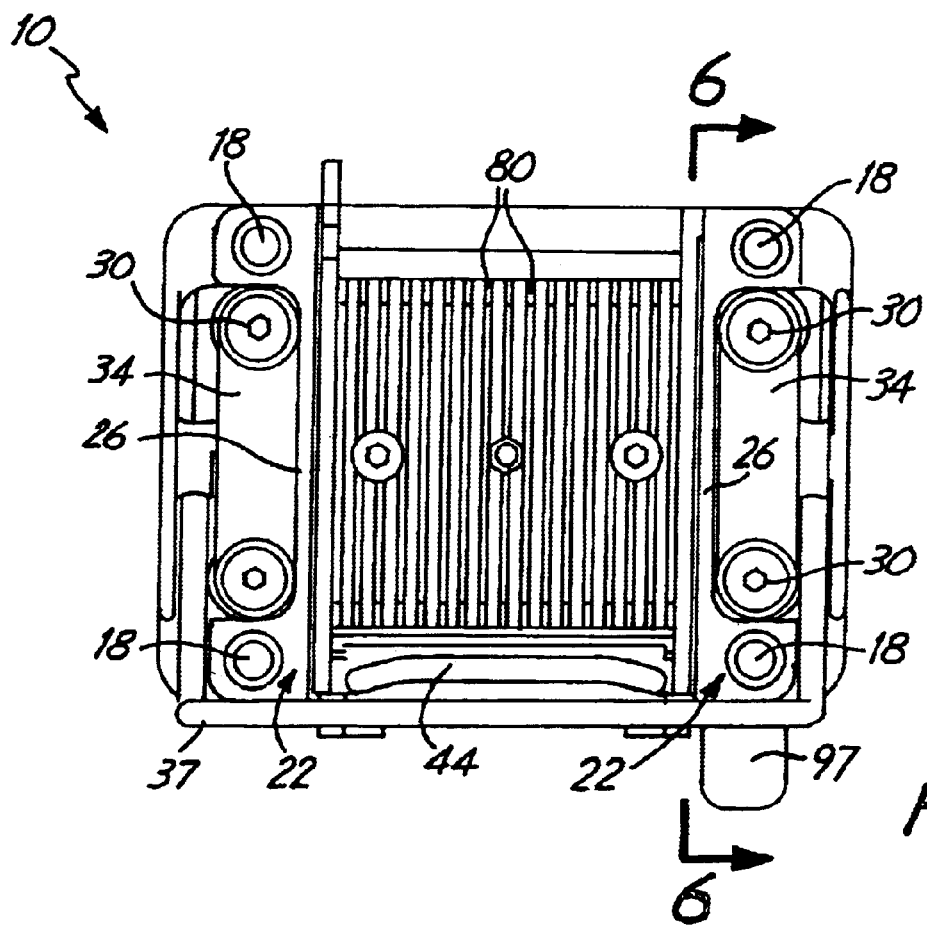
FIG. 5 is a top plan view of the burn-in socket with the cover in a closed position.
Figure 4:
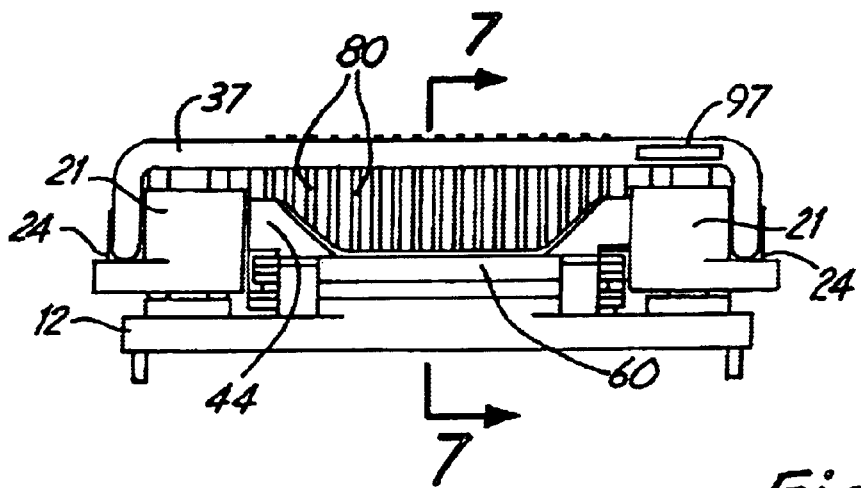
FIG. 4 is a front elevational view of the burn-in socket of the present invention with the cover in a closed position.

In FIG. 1, a burn-in socket made according to the present invention is indicated generally at 10 and includes a support base 12 that would be secured in position inside a burn-in oven. The support base can have locating tabs or pins such as that shown at 13 on the lower surface thereof. The support base 12 is generally a plate-like member that is formed in a rectangular shape with an open center recess as shown in FIGS. 6, 7, 10 and 11, that will support a contact set printed circuit or connector board 14. The contact set or connector board 14 is generally planar and is parallel to a plane of the base.

The support base 12, as can be seen, supports a plurality (four) of corner guide posts 18, that are upright and fixed perpendicular to the support base. These corner posts 18 in turn form sliding guides for a movable sliding frame or clamp 20. The sliding frame 20 has a pair of side members 22, 22 that each have a pair of end sleeves 21. The sleeves of each side member are slideably mounted on a pair of the ports 18. The ports 18 are fixed to the support frame. The side members 22 have outer side straps 24 and inner panels 26 that form a cam housing or chamber. A pair of cam reaction bridge members 28, 28 are supported on the support base 12 on opposite sides thereof cap screws 30 that pass through end pillars 29 on the bridge members. The bridge members are spring loaded, as will be explained. The cam reaction bridge members are positioned in the cam housing or chambers formed between the inner panels 26 and strap 24.

The end pillars 29 support an overhead cam reaction cross member or wall 34, that defines a space between a bottom or downwardly facing, cam follower surface 35 of the respective cross members 34 and the upper surface of the sides of the support base 12. A separate rotatable cam 36 is rotatably mounted on each of side members 22 of the movable sliding frame 20 between the side strap 24 and inner panel 26 of the respective sliding side member 22.

The cams 36 are rotatably mounted with suitable pins 40 to the respective sliding side member 22. The cams 36 are double acting cams which will react to provide a lifting force for the sliding frames against the upper surface 42 of the support base on the opposite sides thereof in alignment with the cams, and also will react against the under surfaces 35 of the bridge cross members 34 to provide a downward load on the pins 40 and thus on the sliding side members 22 of sliding frame 20. The cams are rotated with a bail or handle 37.

Figure 8:
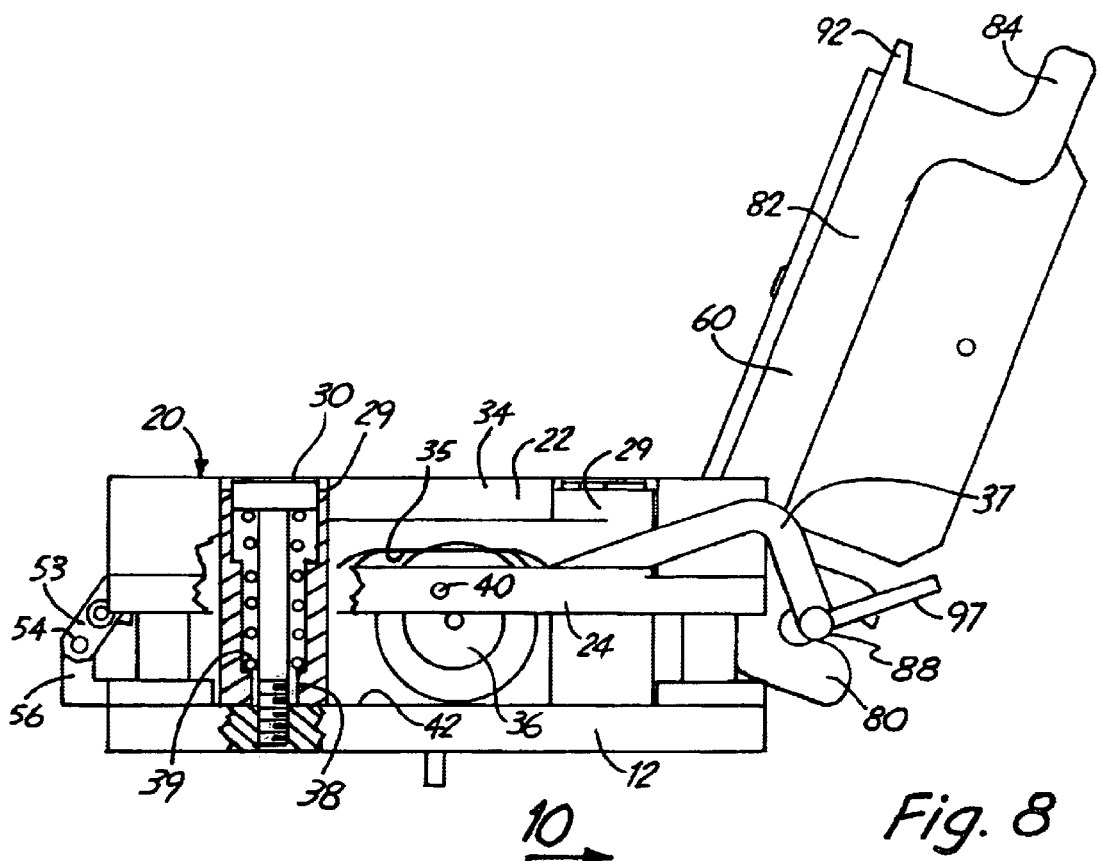
FIG. 8 is a side elevational view of the burn-in socket shown in with the cover in a raised position.
Figure 9:
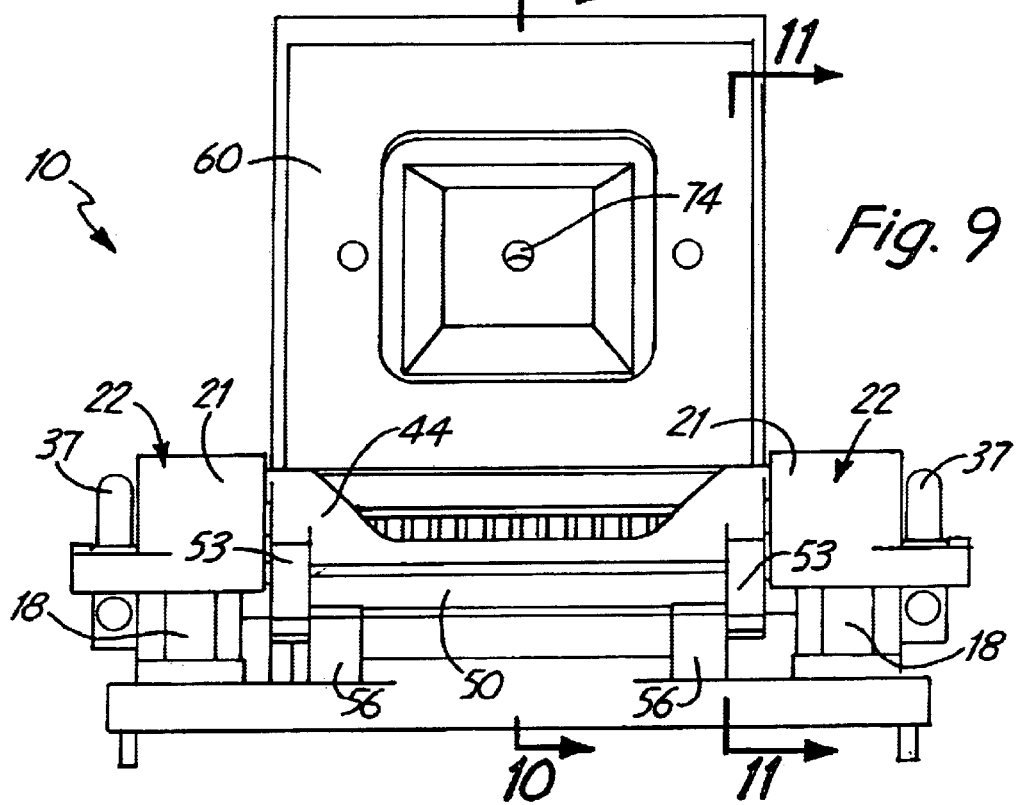
FIG. 9 is a front elevational view of the burn-in socket with the cover in a raised position.

The end pillars 29 and thus bridges 28 are spring loaded on cap screws 30 toward the support base 12, as member and as shown schematically in FIG. 8. A spring 39 is placed between the underside of heads of the cap screws 30 and retainer flanges 38 surrounding the respective cap screw at the bottom of each pillar 29. The pillars 29 and the bridges 28 are thus urged toward the support base with a spring force and will move away from the support base as the cams 36 load the sliding members downwardly and the force is reacted against the bridge surfaces 35.

Figure 10:
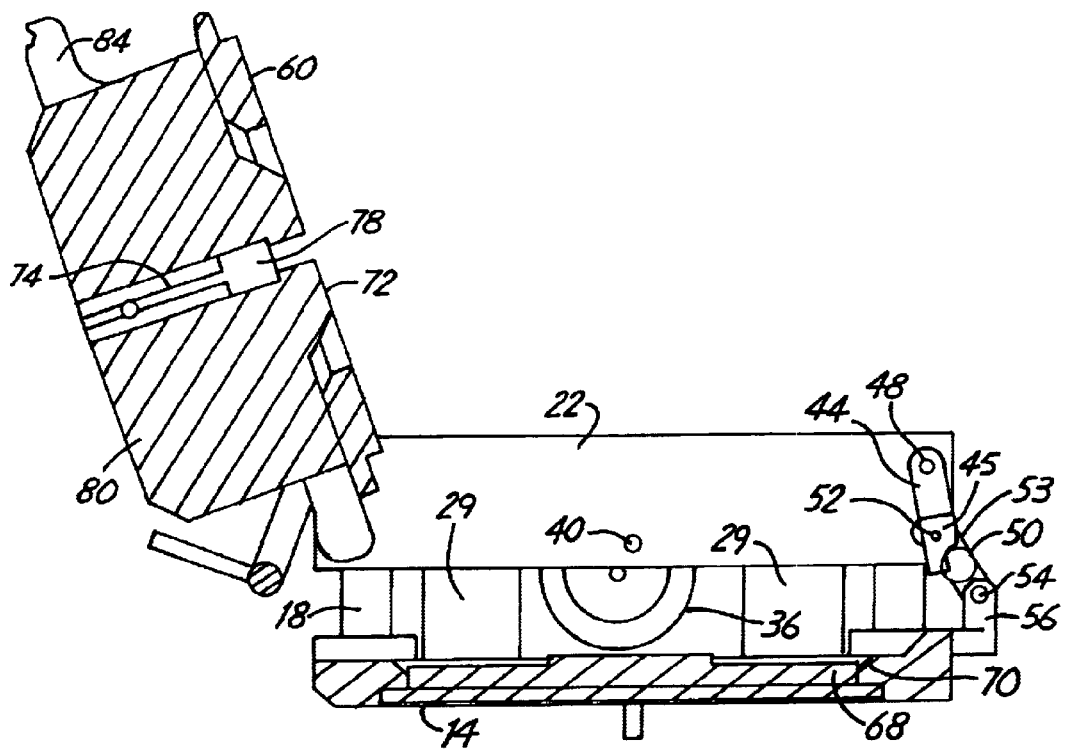
FIG. 10 is a sectional view taken as on line 10—10 in FIG. 9.

The sliding side members 22 carry an integrated circuit clamp arm 44 that is pivotally mounted on a suitable axis indicated schematically at 48 (FIG. 10) on the sliding members 22. The clamp arm 44 extends between the side members 22 adjacent one end of the socket support base 12. The movement of clamp arm 44 about the pivot axis 48 is controlled with a link 50 that in turn has a pair of arms 53 that are pivotally mounted to the clamp arm 44 about a pivot axis 52 (FIG. 10). The opposite ends of the arms 52 of link 50 are pivotally mounted as at 54 to a pair of posts 56 that are fixed to the support base 12. It can thus be seen that as the sliding side members 22 are raised and lowered by operating the cams 36, the clamp arm 44 will move in an arc about the pivot 48, and the ends of the clamp arm will also move toward and away from the support base 12 with the sliding side members 22.

Figure 6:
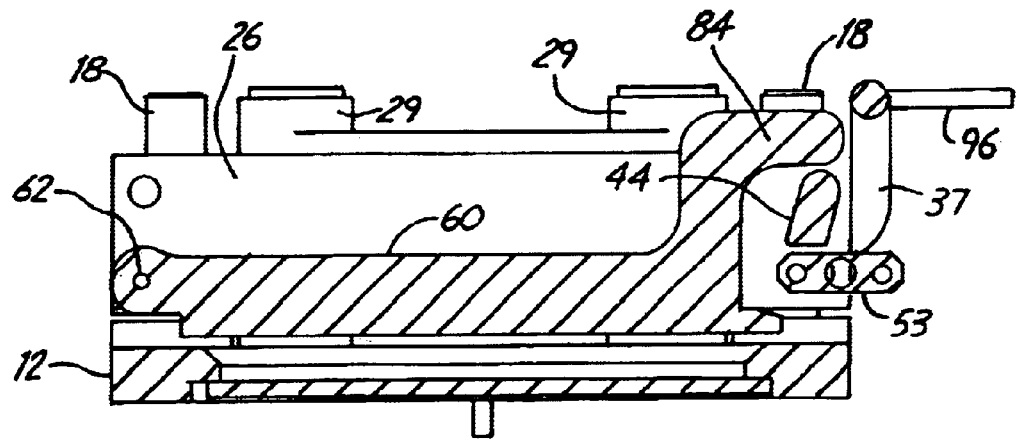
FIG. 6 is a sectional view taken as on line 6—6 in FIG. 5.
Figure 7:
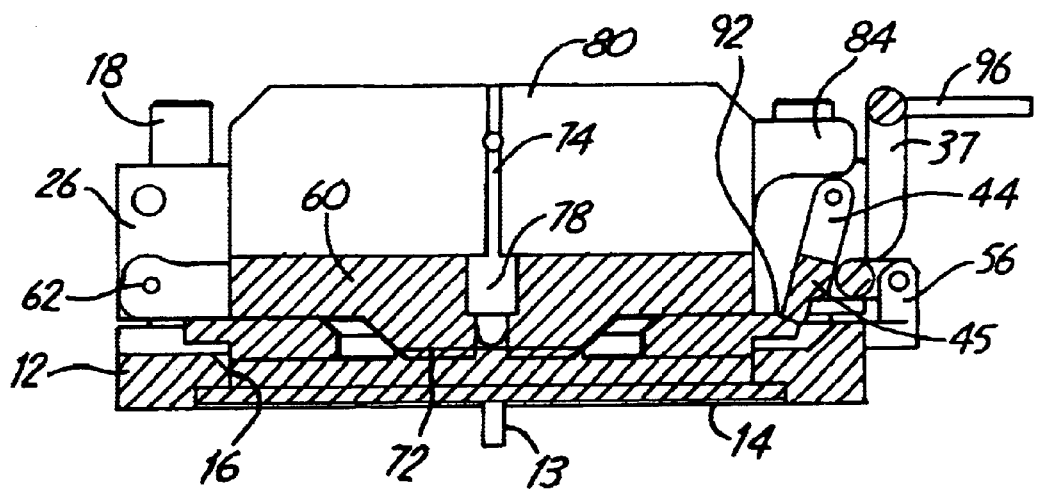
FIG. 7 is a sectional view taken as on line 7—7 in FIG. 4.
Figure 11:
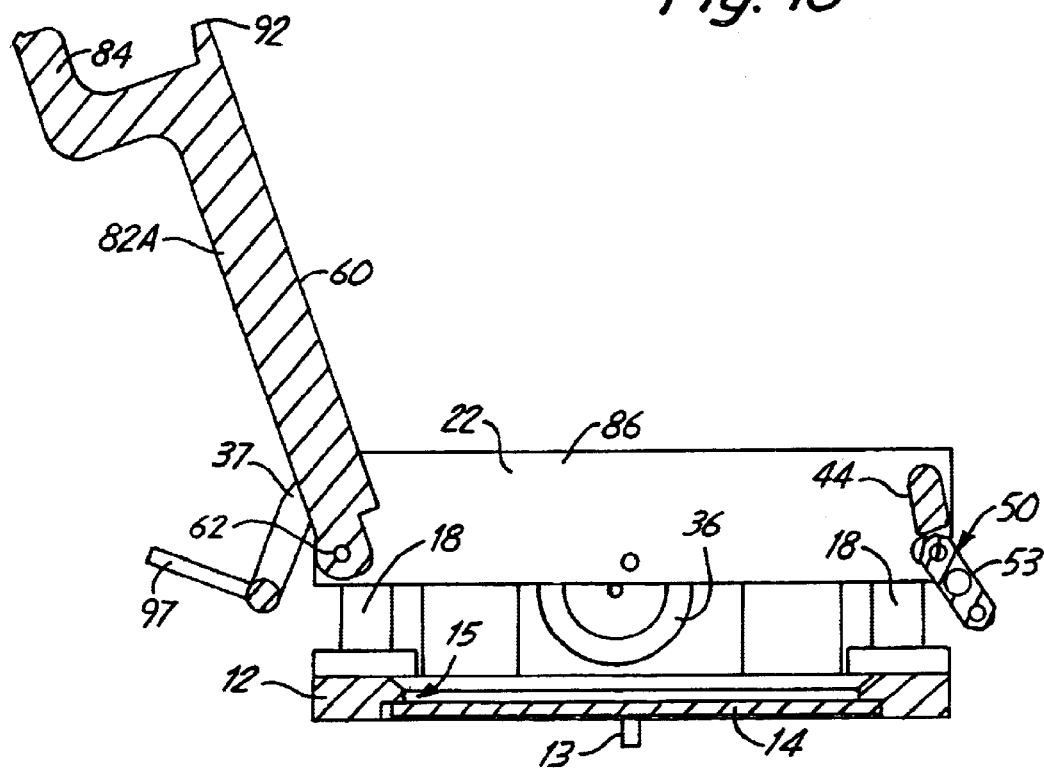
FIG. 11 is a sectional view taken as on line 11—11 in FIGS. 9 and 12.
Figure 12:
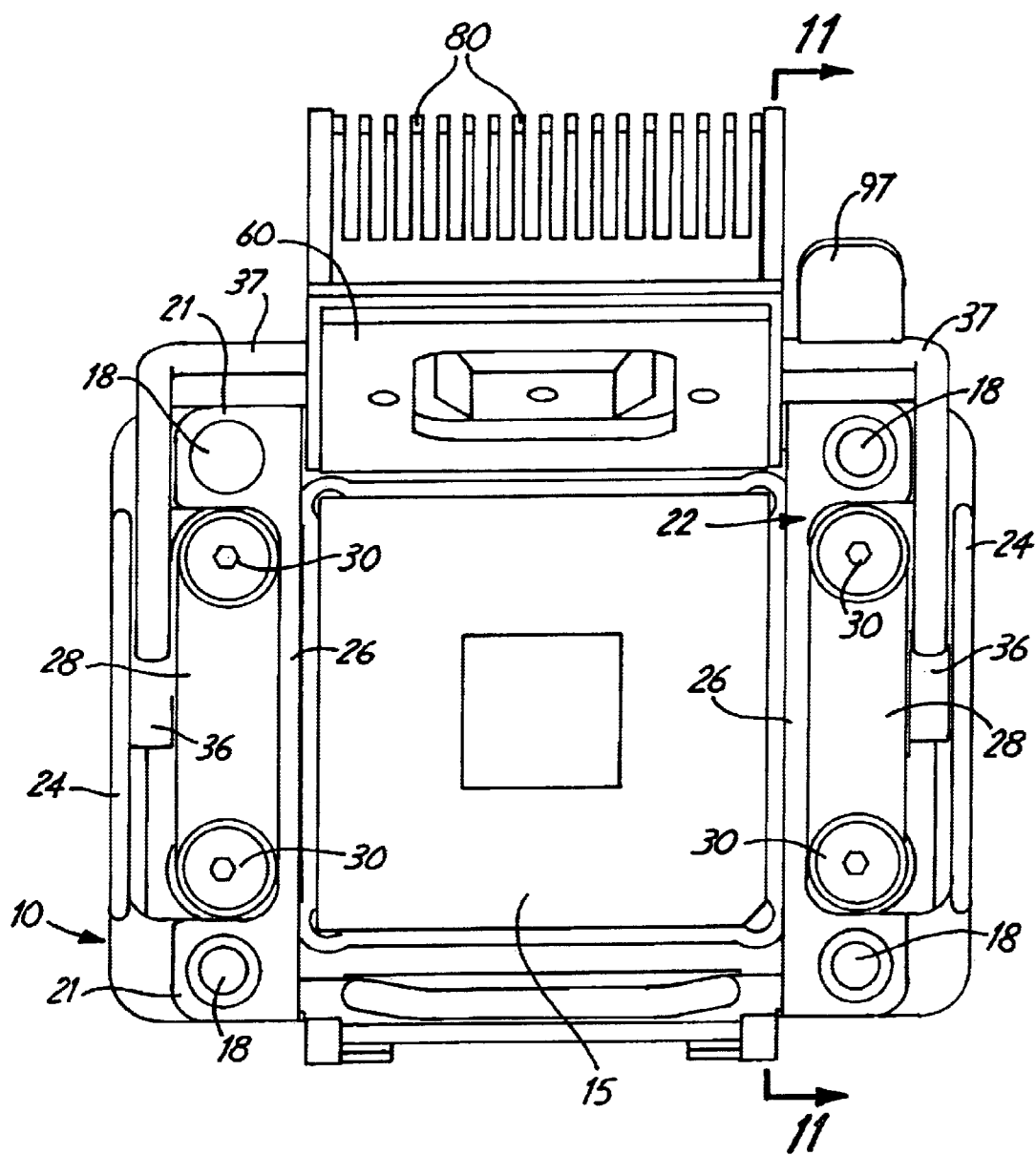
FIG. 12 is a top view with the cover in a raised position.

Additionally, a socket cover 60 is pivotally mounted on a suitable axis indicated at 62 in FIGS. 6, 7 and 11, along one end of the support base 12, opposite from the end mounting clamp arm 44. The lower surface of the socket cover 60 is designed to intimately contact an integrated circuit 68 that is supported within an open center recess 70 of the base frame 12, above or overlying the contact set printed circuit board 14.

As can be seen in FIGS. 7 and 10, the over 60 has a central bore 74 that carries a temperature sensor 78 that is held in intimate contact with the integrated circuit 68 when the cover 60 is closed to the position shown in FIGS. 6 and 7. The temperature sensor 78 is used for sensing the temperature of the integrated circuit 68 under test.

A plurality of heat radiating fins 80 are provided on the upper surface of the cover 60. The cover 60 thus forms a heat sink and heat exchanger. The cover 60 further includes side wall portions 82 and 82A that have clamp lugs 84 and 84A at ends thereof opposite from the hinge axis 62, that protrude or extend outwardly from the free end of the cover 60 a selected amount. The lugs 84 and 84A are closely adjacent to and fit between the inner panels 26 of the sliding members 22.

Side 82A of the cover 60 has a cam receptacle guide ear 86 at the hinge end of the cover (FIG. 1), and this cam receptacle guide ear 86 has a recess 88 therein which will receive the end cross member 37A of the bail 37 when the bail is moved to its open position as shown in FIG. 1, it will hold the cover 60 open. The cams 36 will go over center in the open position to keep the sliding side member 22 of sliding frame 20 raised. The cam guide 88 will be operable to hold the cover 60 raised while the integrated circuit board 68 is removed or inserted.

When the bail 37 is moved to a closed position, and thus rotates the cams 36, the cams 36 will act against the under surfaces 35 of the bridge cross members 34 of the bridges 28, and will provide a reaction load forcing the sliding side members 22 downwardly, and carrying the cover 60 downwardly as well.

The clamp arm 44 will be moved by link 50 to a position where a lower edge overlies one edge of the integrated circuit 68 under test, and as closing is completed the end portion 45 of clamp arm 44 will clamp against a lip 92 (FIG. 7) and hold the integrated circuit against the contact set on circuit board 14 in the closed position of the cover. The cams 36 will go over center as the bail 24 is moved into its closed position shown in FIGS. 3–7. The clamp plate 66 will move down tightly against the peripheral edges of the circuit board 68 and will clamp it in place. The downward force exerted is controlled by the springs 39 acting between pillars 29 and cap screws 30.

Again, the clamp arm 44 is moved to its position as shown in FIG. 7 against the tapered lip 92 on one side of the clamp plate 66, and provides a positive locking force. The clamp lugs 84 and 84A also engage the end portion of clamp arm 44 to securely hold it clamped.

The cross member 24A of the bail 24 is provided with a manual tab 96 that can be used for lifting and lowering the bail as it is manually operated to move between its open and closed positions.

It thus can be seen that the hinged cover 60 that carries the heat radiating fins 80, provides a positive clamp against the integrated circuit to hold it into position to contact the contact set on circuit board 14 of the burn-in socket.

The cover also carries a cartridge heater (not shown), as well as the temperature sensor 78 for controlling the temperature of the integrated circuit under test. The fins 80 can be subjected to an airflow for cooling when needed.

The force of clamping is regulated by the springs 39 that mount the bridge members. The springs 39 react the load from the cams 36 and clamp arm 44 urging the cover 60 to clamp an integrated circuit.

Although the present invention has been described with reference to preferred embodiments, workers skilled in the art will recognize that changes may be made in form and detail without departing from the spirit and scope of the invention.

What is claimed is:

1. A clamping socket apparatus for holding an integrated circuit in contact with a connector board comprising a support base, a support for an integrated circuit board in center portions of the support base, a sliding frame slidably movable in a direction generally perpendicular to a plane of the support base, a cover of size to overlie the center portions and cooperating with the base to hold an integrated circuit to be tested against a supported connector board, said cover being hinged along one edge about a hinge axis relative to the sliding frame, a cam actuator for controlling the sliding movement of the sliding frame, a cam actuator lever for moving the cams between a released position wherein the sliding frame is raised from the base, and a clamping position, the cover being pivotable from an open position to a closed position overlying the base and engaging an integrated circuit to be held against a supported connector board with the sliding frame in its clamped position and a cam actuator lever engaging member on the cover that is engaged by the cam actuator lever as the lever moves the sliding frame from the clamping position to the release position to pivot the cover to its open position.

2. The apparatus of claim 1 and a plurality of fins on the exterior of the cover for providing heat exchange surfaces for the cover.

3. The apparatus of claim 1, wherein said cam actuator lever comprises a handle having a cross member that moves in an arc as actuated, the cross engaging the cam actuator lever engaging member on the cover to moving the cover to its open position.

4. The apparatus of claim 1, wherein said sliding frame comprises a pair of sliding side members on opposite sides of the cover, said cover being pivotally mounted to said side members, said cam actuator comprising a pair of cams, one engaging each of the side members, both of the cams for the side members being operated simultaneously, the cam actuator lever engaging member on the cover comprising an arm extending outwardly from the hinge axis on an opposite side of the hinge axis from the cover, and said cam actuator engaging the arm as the cam actuator moves to a position that moves the sliding frame from the clamping position to the release position to thereby pivot the cover to its open position.

5. The apparatus of claim 4, wherein said cams are carried on said slidable slide members, a pair of bridge members overlying the cams, respectively, the cams engaging the bridge members to urge the sliding side members to the clamping position for clamping an integrated circuit against a supported connector board on the support base.

6. The apparatus of claim 5, wherein said cam actuator comprises a bail handle having a member that extends between opposite sides of the sliding frame, generally parallel to the hinge axis of the cover, and said bail comprising the cam lever actuator lever engaging member and said bail moving to an opposite side of the support base from its position when the cover is in its closed position, said cross member engaging the cam actuator engaging member on the cover and pivoting the cover to its open position when the bail is moved to move the sliding frame to its released position.

7. A socket assembly for holding an integrated circuit during testing or burn-in comprising:
 a base, said base having peripheral walls defining a central opening of the shape of an integrated circuit to be held against provided contacts held relative to the base;
 a movable frame slidably mounted relative to said base for movement toward and away from the provided contacts;
 a cam actuator carried on the movable frame and reacting against surfaces carried by the base, said cam actuator being movable to move the frame toward and away from the provided contacts upon selective movement of the cam actuator; and
 a clamping cover pivotally mounted on the movable frame for movement from a position overlying the contacts to a position permitting access to the contacts.

8. The socket assembly of claim 7, and a locking arm on a side of the frame, said locking arm being pivotally mounted onto the movable frame, a guide link for moving the locking arm to engage an edge of the cover as the cover moves to its position overlying the contacts.

9. The socket assembly of claim 8, wherein said cam actuator comprises a pair of cams on sides of the movable frame perpendicular to the side on which the locking arm is positioned, and a handle for simultaneously moving the cams about cam pivot axes.

10. The socket assembly of claim 7, wherein the cam actuator comprise a pair of cams mounted to the movable frame on opposite sides of the base about a common axis, and cam reaction members carried on the base and overlying the cams, respectively, the cams also engaging surfaces of the base so that as the cams are rotated, the movable frame is moved selectively toward and away from the base.

11. The socket assembly of claim 10, wherein the cam reaction members comprise bridges supported on the base at opposite ends of the bridges and the bridges having walls overlying the respective cam.

12. The socket assembly of claim 9, wherein the cover is hinged to the movable frames along an edge of the base about an axis parallel to the cam pivot axes.

13. The socket assembly of claim 11, wherein springs are provided between the base and the bridges to spring load the bridges toward the base.

14. The socket assembly of claim 7, wherein the base peripheral walls have recesses on inner edges thereof defining the central opening, said recesses receiving a circuit board carrying the contacts, and the contacts having a contact plane positioned at a level so that an integrated circuit contacting the contacts is clamped against the contacts by the cover when the cover is in its position overlying the contacts and the slidable frames and cover are moved toward the contacts by the cam actuator.

15. The socket assembly of claim 14, wherein the cover has a temperature sensor therein for contacting an integrated circuit that is clamped against the contacts by the cover.

16. A socket assembly for holding an integrated circuit during testing or burn-in comprising:
 a base, said base having peripheral walls defining a central opening that is generally rectangular in shape and of a size to permit an integrated circuit to be held to be received adjacent edges of the opening;
 the peripheral walls having a support for a printed circuit to underlie the central opening and supported on the peripheral walls;
 a pair of movable frames along two opposite sides of said central opening, said frames being movable toward and away from the peripheral walls defining the base;
 an actuator for moving the movable frames toward and away from the base, and
 a cover pivotally mounted to and extending between the movable frames, the cover being pivotable to a position overlying the central opening, and the actuator being operable to move the frames and cover to a clamping position overlying the central opening and moved toward the base, the cover being pivotably to a position clearing the central opening and the movable frames being movable to a loading position where the frames are moved away from the base.

17. The socket assembly of claim 16, wherein said actuator comprises a cam actuator rotatably mounted on the moveable frame and engaging surfaces supported with respect to the base to provide reaction forces moving the moveable frames selectively toward and away from the base.

18. The socket assembly of claim 16 and a handle mounted on the cam actuators for manually rotating the cam actuators, the handle including an arm engaging portion, an arm mounted on the cover and extending from the cover to a side of the pivotal mounting of the cover opposite from the cover, the arm being moved to pivot the cover when the handle is moved to actuate the cams.

19. The socket assembly of claim 17, wherein the cover has a free edge on a side of the cover opposite the pivotal mounting of the cover, and a locking arm pivotally mounted on the movable frames on a side of the movable frames opposite the pivotal mounting of the cover, and a link between the base and the locking arm to move the locking arm to overlie and clamp the free edge of the cover with the cover overlying the central opening and with the movable frames moved toward the base.

20. The socket assembly of claim 19, wherein the free edge of the cover has a beveled surface which is engaged by the locking arm to clamp the cover against the integrated circuit engaging the contacts.

* * * * *

UNITED STATES PATENT AND TRADEMARK OFFICE
CERTIFICATE OF CORRECTION

PATENT NO. : 6,741,089 B2
DATED : May 25, 2004
INVENTOR(S) : Chad M. Conroy

It is certified that error appears in the above-identified patent and that said Letters Patent is hereby corrected as shown below:

Column 5,
Line 1, delete "cams" and insert -- cam actuator --.

Column 6,
Line 66, change "16" to -- 17 --.
Line 67, change "actuators" to -- actuator --.

Column 7,
Line 1, change "actuators" to -- actuator --.
Line 5, delete "cams" and insert -- cam actuator --.

Signed and Sealed this

Seventh Day of December, 2004

JON W. DUDAS
*Director of the United States Patent and Trademark Office*